US012347636B2

(12) United States Patent
Elmiger et al.

(10) Patent No.: US 12,347,636 B2
(45) Date of Patent: Jul. 1, 2025

(54) SYSTEMS AND METHODS FOR DETECTING WELDED CONTACTS IN A SWITCH SYSTEM

(71) Applicant: Rockwell Automation Technologies, Inc., Mayfield Heights, OH (US)

(72) Inventors: David Elmiger, Hitzkirch (CH); David M. Messersmith, Kenosha, WI (US); Kyle B. Adkins, Oak Creek, WI (US); Andrew E. Carlson, Franklin, WI (US)

(73) Assignee: ROCKWELL AUTOMATION TECHNOLOGIES, INC., Mayfield Heights, OH (US)

(*) Notice: Subject to any disclaimer, the term of this patent is extended or adjusted under 35 U.S.C. 154(b) by 343 days.

(21) Appl. No.: 17/660,711

(22) Filed: Apr. 26, 2022

(65) Prior Publication Data

US 2023/0343533 A1 Oct. 26, 2023

(51) Int. Cl.
*G01R 31/327* (2006.01)
*H01H 47/00* (2006.01)
*H01H 47/22* (2006.01)

(52) U.S. Cl.
CPC ....... *H01H 47/002* (2013.01); *G01R 31/3278* (2013.01); *H01H 47/22* (2013.01)

(58) Field of Classification Search
CPC ... H01H 47/002; H01H 47/22; G01R 31/3278
See application file for complete search history.

(56) References Cited

U.S. PATENT DOCUMENTS

| | | | |
|---|---|---|---|
| 8,355,230 B2 * | 1/2013 | Culligan | H02H 7/30 361/93.6 |
| 8,901,934 B2 | 12/2014 | Namou | |
| 10,312,900 B2 | 6/2019 | Lenker | |
| 2020/0185175 A1 | 6/2020 | Nakayama | |
| 2023/0213582 A1 * | 7/2023 | Buescher | G08B 5/36 340/644 |

FOREIGN PATENT DOCUMENTS

| | | |
|---|---|---|
| CN | 112041694 A | 12/2020 |
| CN | 110140056 B | 4/2021 |
| DE | 10160106 B4 | 6/2006 |
| DE | 102006054294 B4 | 4/2009 |
| JP | 09289792 A * | 11/1997 |
| JP | 5370553 B1 | 12/2013 |
| KR | 20140061637 A | 5/2014 |

OTHER PUBLICATIONS

European Patent Office, "Communication pursuant to Rule 62 EPC, Extended European Search Report", application No. 23168726.0, issued on Sep. 15, 2023, 7 pages.

* cited by examiner

*Primary Examiner* — Walter L Lindsay, Jr.
*Assistant Examiner* — Milton Gonzalez

(57) ABSTRACT

Systems and methods are provide for detecting weld relay devices within a switching device by: closing one or more first relay devices, wherein the one or more first relay devices are configured to selectively connect and disconnect a first phase of electric power from a power source; opening one or more second relay devices and one or more third switches; detecting whether there is electric current through the one or more second relay devices; and in response to detecting that there is electric current through the one or more second relay devices, determining that the one or more second relay devices are welded.

19 Claims, 12 Drawing Sheets

SYSTEMS AND METHODS FOR DETECTING WELDED CONTACTS IN A SWITCH SYSTEM

BACKGROUND

This section is intended to introduce the reader to various aspects of art that may be related to various aspects of the present disclosure, which are described or claimed below. This discussion is believed to be helpful in providing the reader with background information to facilitate a better understanding of the various aspects of the present disclosure. Accordingly, it should be understood that these statements are to be read in this light, and not as admissions of prior art.

The present disclosure relates generally to switching devices, and more particularly to sensing properties associated with the switching devices and operation of the switching devices. Switching devices are generally used throughout industrial, commercial, material handling, process, and manufacturing settings, to mention only a few. As used herein, "switching device" is generally intended to describe any type of electromechanical switching device, such as mechanical switching devices (e.g., a contactor, a relay, air break devices, and controlled atmosphere devices) or solid-state devices (e.g., a silicon-controlled rectifier (SCR)). More specifically, switching devices generally open to disconnect electric power from a load and close to connect electric power to the load. For example, switching devices may connect and disconnect three-phase electric power to an electric motor. Over time, these switching devices may begin to wear and operate less effectively. As such, it may be desirable to monitor the wear and state of the switching devices over time to ensure proper operations.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In an embodiment, a system may include a power source, a switching device, and a control system. The switching device includes: one or more first relay devices configured to selectively connect and disconnect a first phase of electric power from the power source; one or more second relay devices configured to selectively connect and disconnect a second phase of electric power from the power source; and one or more third relay devices configured to selectively connect and disconnect a third phase of electric power from the power source. The control system is configured to: close the one or more first relay devices; open the one or more second relay devices and the one or more third relay devices; detect whether there is electric current through the one or more second relay devices; and in response to detecting that there is electric current through the one or more second relay devices, determine that the one or more second relay devices are welded.

In another embodiment, a method for providing weld detection may include: closing one or more first relay devices, wherein the one or more first relay devices are configured to selectively connect and disconnect a first phase of electric power from a power source; opening one or more second relay devices and one or more third switches, wherein the one or more second relay devices are configured to selectively connect and disconnect a second phase of electric power from the power source, and wherein the one or more third relay devices are configured to selectively connect and disconnect a third phase of electric power from the power source; detecting whether there is electric current through the one or more second relay devices; and in response to detecting that there is electric current through the one or more second relay devices, determining that the one or more second relay devices are welded.

In another embodiment, a switching device includes: one or more first relay devices configured to selectively connect and disconnect a first phase of electric power from the power source; one or more second relay devices configured to selectively connect and disconnect a second phase of electric power from the power source; one or more third relay devices configured to selectively connect and disconnect a third phase of electric power from the power source; and a control circuitry configured to: close the one or more first relay devices; open the one or more second relay devices and the one or more third relay devices; detect whether there is electric current through the one or more second relay devices; and in response to detecting that there is electric current through the one or more second relay devices, determine that the one or more second relay devices are welded.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
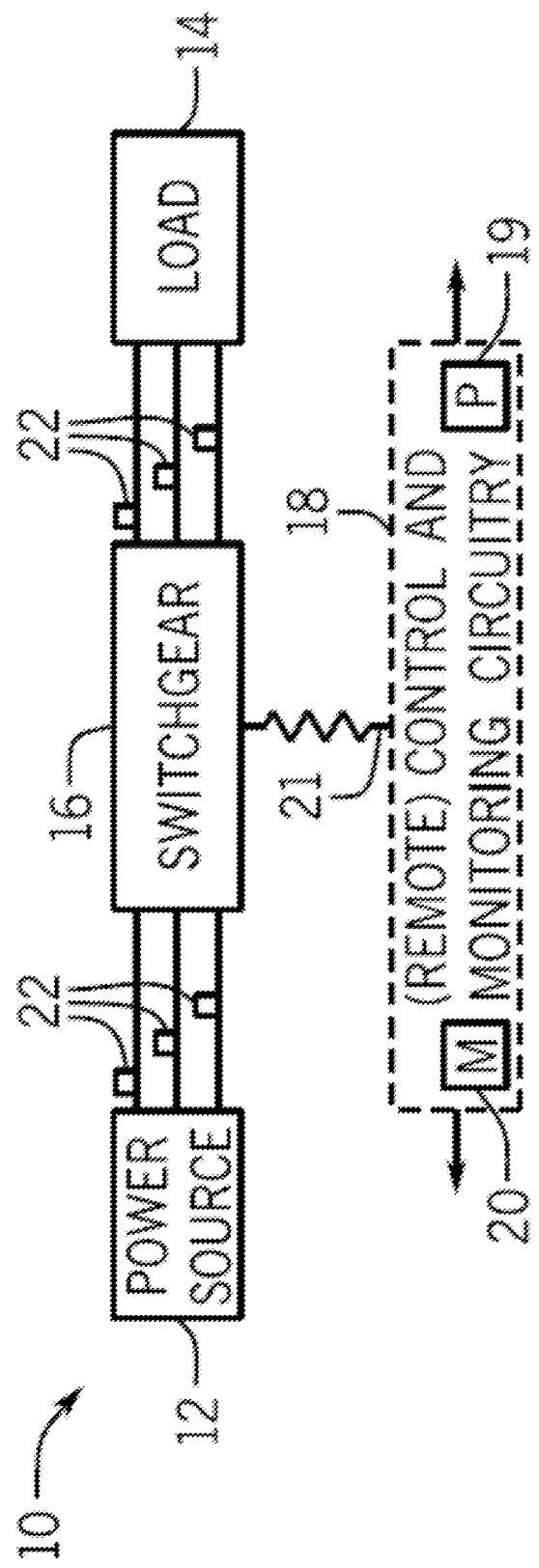
FIG. 1 is a diagrammatical representation of a set of switching devices to provide power to an electrical load, in accordance with an embodiment described herein.

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. It should be noted that the term "multimedia" and "media" may be used interchangeably herein.

As described above, switching devices are used in various implementations—such as industrial, commercial, material handling, manufacturing, power conversion, or power distribution—to connect or disconnect electric power from a load. For example, a number of switching devices may be used to control operations, monitor conditions, and perform other operations related to various equipment in an industrial automation system. As such, the switching devices may be used to coordinate operations across a number of devices.

In some embodiments, a switching device includes multiple relay devices. For example, a three-phase switching device connecting to three-phase electric power may include three poles and each pole may be connected to a respective phase of the power. Each pole may include one or more relay devices. The switching device may decrease in an overall breaking capacity when one or more of the relay devices are welded. In some embodiments, the switching device may continue operating under normal conditions with one or more welded relay devices but may have limited capability for abnormal conditions. Thus, it is advantageous to have systems and methods for providing weld detection in switching devices. Through weld detection, the reliability and safety of the switching device can be significantly increased, and potential unsafe states can be prevented. Embodiments of the present disclosure are directed to determining whether one or more relay devices within a switching device are welded. As described herein, a welded relay device may refer to a relay device that has a contact sticking to a corresponding contact, such that an armature of the relay device may be prevented from retracting to an open position to disconnect electric power from a load.

FIG. 1 depicts a system 10 that includes a power source 12, a load 14, and a switchgear 16, which includes one or more switching devices that may be controlled using the techniques described herein. In the depicted embodiment, the switchgear 16 may selectively connect or disconnect three-phase electric power output by the power source 12 to the load 14, which may be an electric motor or any other powered device. In this manner, electrical power flows from the power source 12 to the load 14. For example, switching devices in the switchgear 16 may close to connect electric power to the load 14. On the other hand, the switching devices in the switchgear 16 may open to disconnect electric power from the load 14. In some embodiments, the power source 12 may be an electrical grid.

It should be noted that the three-phase implementation described herein is not intended to be limiting. More specifically, certain aspects of the disclosed techniques may be employed on single-phase circuitry or for applications other than power an electric motor. Additionally, it should be noted that in some embodiments, energy may flow from the power source 12 to the load 14. In other embodiments, energy may flow from the load 14 to the power source 12 (e.g., a wind turbine or another generator). More specifically, in some embodiments, energy flow from the load 14 to the power source 12 may transiently occur, for example, when overhauling a motor.

In some embodiments, operation of the switchgear 16 (e.g., opening or closing of switching devices) may be controlled by control and monitoring circuitry 18. More specifically, the control and monitoring circuitry 18 may instruct the switchgear 16 to connect or disconnect electric power. Accordingly, the control and monitoring circuitry 18 may include one or more processors 19 and memory 20. More specifically, as will be described in more detail below, the memory 20 may be a tangible, non-transitory, computer-readable medium that stores instructions, which when executed by the one or more processors 19 perform various processes described. It should be noted that non-transitory merely indicates that the media is tangible and not a signal. Many different algorithms and control strategies may be stored in the memory and implemented by the processor 19, and these will typically depend upon the nature of the load, the anticipated mechanical and electrical behavior of the load, the particular implementation, behavior of the switching devices, and so forth.

Additionally, as depicted, the control and monitoring circuitry 18 may be remote from the switchgear 16. In other words, the control and monitoring circuitry 18 may be communicatively coupled to the switchgear 16 via a network 21. In some embodiments, the network 21 may utilize various communication protocols such as DeviceNet, Profibus, Modbus, and Ethernet, to only mention a few. For example, to transmit signals between the control and monitoring circuitry 18 may utilize the network 21 to send, make, or break instructions to the switchgear 16. The network 21 may also communicatively couple the control and monitoring circuitry 18 to other parts of the system 10, such as other control circuitry or a human-machine-interface (not separately depicted). Additionally, the control and monitoring circuitry 18 may be included in the switchgear 16 or directly coupled to the switchgear, for example, via a serial cable.

Furthermore, as depicted, the electric power input to the switchgear 16 and output from the switchgear 16 may be monitored by sensors 22. More specifically, the sensors 22 may monitor (e.g., measure) the characteristics (e.g., voltage or current) of the electric power. Accordingly, the sensors 22 may include voltage sensors and current sensors. These sensors may alternatively be modeled or calculated values determined based on other measurements (e.g., virtual sensors). Many other sensors and input devices may be used, depending upon the parameters available and the application. In some embodiments, the sensors 22 may be included within the switchgear 16. Additionally, the characteristics of the electric power measured by the sensors 22 may be communicated to the control and monitoring circuitry 18 and used as the basis for algorithmic computation and generation of waveforms (e.g., voltage waveforms or current waveforms) that depict the electric power. More specifically, the waveforms generated based on input from the sensors 22 monitoring the electric power input into the switchgear 16 may be used to define the control of the switching devices, for example, by turning off the power source 12 when the switching devices are detected to be welded together. The waveforms generated based on the sensors 22 monitoring the electric power output from the switchgear 16 and supplied to the load 14 may be used in a feedback loop to, for example, monitor conditions of the load 14.

Figure 2:
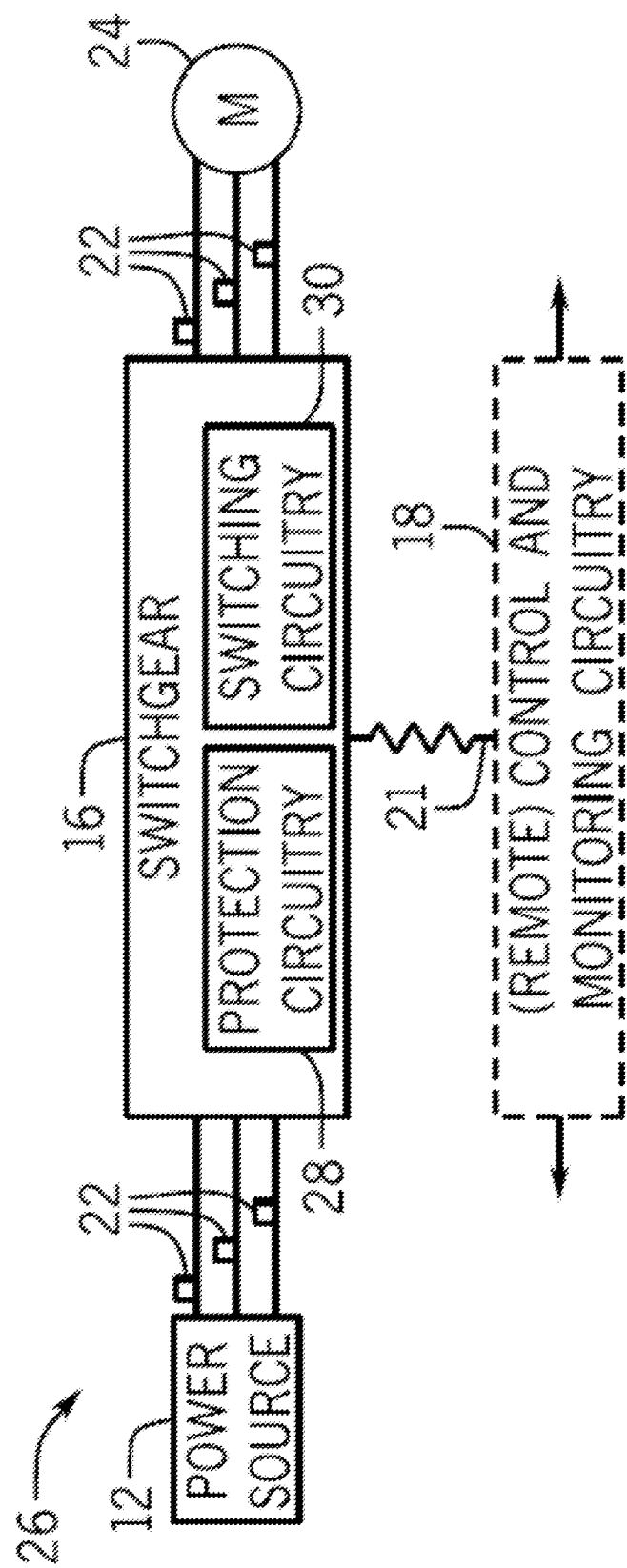
FIG. 2 is a similar diagrammatical representation of a set of switching devices to provide power to an electrical motor, in accordance with an embodiment described herein.

As described above, the switchgear 16 may connect and/or disconnect electric power from various types of loads 14, such as an electric motor 24 included in the motor system 26 depicted in FIG. 2. As depicted, the switchgear 16 may connect and/or disconnect the power source 12 from the electric motor 24, such as during startup and shut down. Additionally, as depicted, the switchgear 16 will typically include or function with protection circuitry 28 and the actual switching circuitry 30 that makes and breaks connections between the power source and the motor windings. More specifically, the protection circuitry 28 may include fuses and/or circuit breakers, and the switching circuitry 30 will typically include relays, contactors, and/or solid-state switches (e.g., SCRs, MOSFETs, IGBTs, or GTOs), such as within specific types of assembled equipment (e.g., motor starters).

More specifically, the switching devices included in the protection circuitry 28 may disconnect the power source 12 from the electric motor 24 when a weld, an overload, a short circuit condition, or any other unwanted condition is detected. Such control may be based on the un-instructed operation of the device (e.g., due to heating, detection of excessive current, and/or internal fault), or the control and monitoring circuitry 18 may instruct the switching devices (e.g., contactors or relays) included in the switching circuitry 30 to open or close. For example, the switching circuitry 30 may include one (e.g., a three-phase contactor) or more contactors (e.g., three or more single-pole, single current-carrying path switching devices).

Accordingly, to start the electric motor 24, the control and monitoring circuitry 18 may instruct the one or more contactors in the switching circuitry 30 to close individually, together, or in a sequential manner. On the other hand, to stop the electric motor 24, the control and monitoring circuitry 18 may instruct the one or more contactors in the switching circuitry 30 to open individually, together, or in a sequential manner. When the one or more contactors are closed, electric power from the power source 12 is connected to the electric motor 24 or adjusted and, when the one or more contactors are open, the electric power is removed from the electric motor 24 or adjusted. Other circuits in the system may provide controlled waveforms that regulate operation of the motor (e.g., motor drives, automation controllers, etc.), such as based upon movement of articles or manufacture, pressures, temperatures, and so forth. Such control may be based on varying the frequency of power waveforms to produce a controlled speed of the motor.

In some embodiments, the control and monitoring circuitry 18 may determine when to open or close the one or more contactors based at least in part on the characteristics of the electric power (e.g., voltage, current, or frequency) measured by the sensors 22. Additionally, the control and monitoring circuitry 18 may receive an instruction to open or close the one or more contactors in the switching circuitry 30 from another part of the motor system 26, for example, via the network 21.

Figure 3:
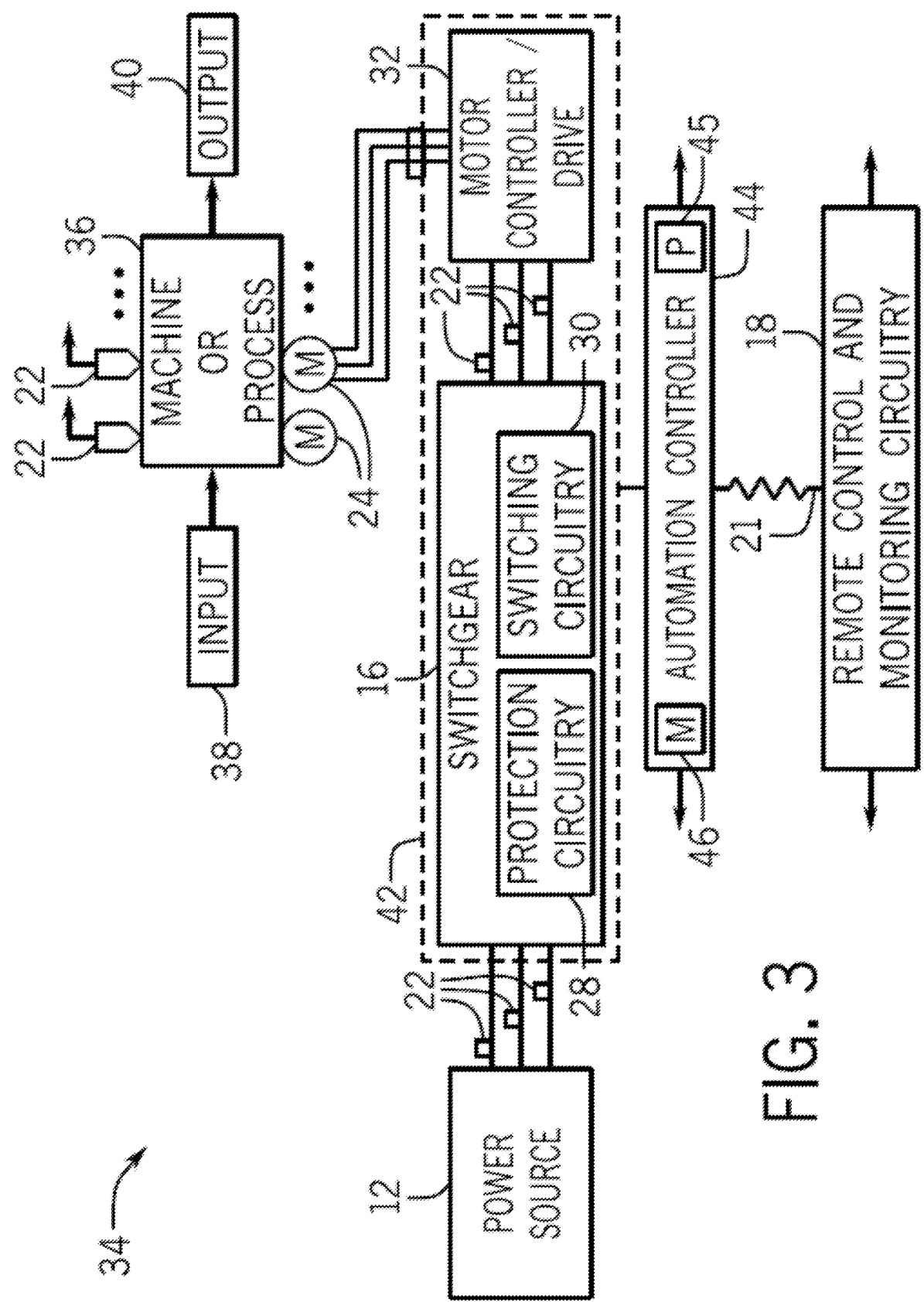
FIG. 3 is a similar diagrammatical representation of a set of switching devices to provide power to an electrical motor, in accordance with an embodiment described herein.

In addition to using the switchgear 16 to connect or disconnect electric power directly from the electric motor 24, the switchgear 16 may connect or disconnect electric power from a motor controller/drive 32 included in a machine or process system 34 as shown in FIG. 3. More specifically, the system 34 includes a machine or process 36 that receives an input 38 and produces an output 40 as depicted in FIG. 3.

To facilitate producing the output 40, the machine or process 36 may include various actuators (e.g., electric motors 24) and sensors 22. As depicted in FIG. 3, one of the electric motors 24 is controlled by the motor controller/drive 32. More specifically, the motor controller/drive 32 may control the velocity (e.g., linear and/or rotational), torque, and/or position of the electric motor 24. Accordingly, as used herein, the motor controller/drive 32 may include a motor starter (e.g., a wye-delta starter), a soft starter, a motor drive (e.g., a frequency converter), a motor controller, or any other desired motor powering device. Additionally, since the switchgear 16 may selectively connect or disconnect electric power from the motor controller/drive 32, the switchgear 16 may indirectly connect or disconnect electric power from the electric motor 24.

As used herein, the "switchgear/control circuitry" 42 is used to generally refer to the switchgear 16 and the motor controller/drive 32. As depicted, the switchgear/control circuitry 42 is communicatively coupled to a controller 44 (e.g., an automation controller. More specifically, the controller 44 may be a programmable logic controller (PLC) that locally (or remotely) controls operation of the switchgear/control circuitry 42. For example, the controller 44 may instruct the motor controller/driver 32 regarding a desired velocity of the electric motor 24. Additionally, the controller 44 may instruct the switchgear 16 to connect or disconnect electric power. Accordingly, the controller 44 may include one or more processors 45 and memory 46. More specifically, the memory 46 may be a tangible non-transitory computer-readable medium on which instructions are stored. As will be described in more detail below, the computer-readable instructions may be configured to perform various processes described when executed by the one or more processors 45. In some embodiments, the controller 44 may also be included within the switchgear/control circuitry 42.

Furthermore, the controller 44 may be coupled to other parts of the machine or process system 34 via the network 21. For example, as depicted, the controller 44 is coupled to the remote control and monitoring circuitry 18 via the network 21. More specifically, the automation controller 44 may receive instructions from the remote control and monitoring circuitry 18 regarding control of the switchgear/control circuitry 42. Additionally, the controller 44 may send measurements or diagnostic information, such as the status of the electric motor 24, to the remote control and monitoring circuitry 18. In other words, the remote control and monitoring circuitry 18 may enable a user to control and monitor the machine or process 36 from a remote location.

Moreover, sensors 22 may be included throughout the machine or process system 34. More specifically, as depicted, sensors 22 may monitor electric power supplied to the switchgear 16, electric power supplied to the motor controller/drive 32, and electric power supplied to the electric motor 24. Additionally, as depicted, sensors 22 may be included to monitor the machine or process 36. For example, in a manufacturing process, sensors 22 may be included to measure speeds, torques, flow rates, pressures, the presence of items and components, or any other parameters relevant to the controlled process or machine.

As described above, the sensors 22 may provide feedback information gathered regarding the switchgear/control circuitry 42, the motor 24, and/or the machine or process 36 to the control and monitoring circuitry 18 in a feedback loop. More specifically, the sensors 22 may provide the gathered information to the automation controller 44 and the automation controller 44 may relay the information to the remote control and monitoring circuitry 18. Additionally, the sensors 22 may provide the gathered information directly to the remote control and monitoring circuitry 18, for example via the network 21.

To facilitate operation of the machine or process 36, the electric motor 24 converts electric power to provide mechanical power. To help illustrate, an electric motor 24 may provide mechanical power to various devices. For example, the electric motor 24 may provide mechanical power to a fan, a conveyer belt, a pump, a chiller system, and various other types of loads that may benefit from the advances proposed.

As discussed in the above examples, the switchgear/control circuitry 42 may control operation of a load 14 (e.g., electric motor 24) by controlling electric power supplied to the load 14. For example, switching devices (e.g., contactors) in the switchgear/control circuitry 42 may be closed to supply electric power to the load 14 and opened to disconnect electric power from the load 14.

Figure 4:
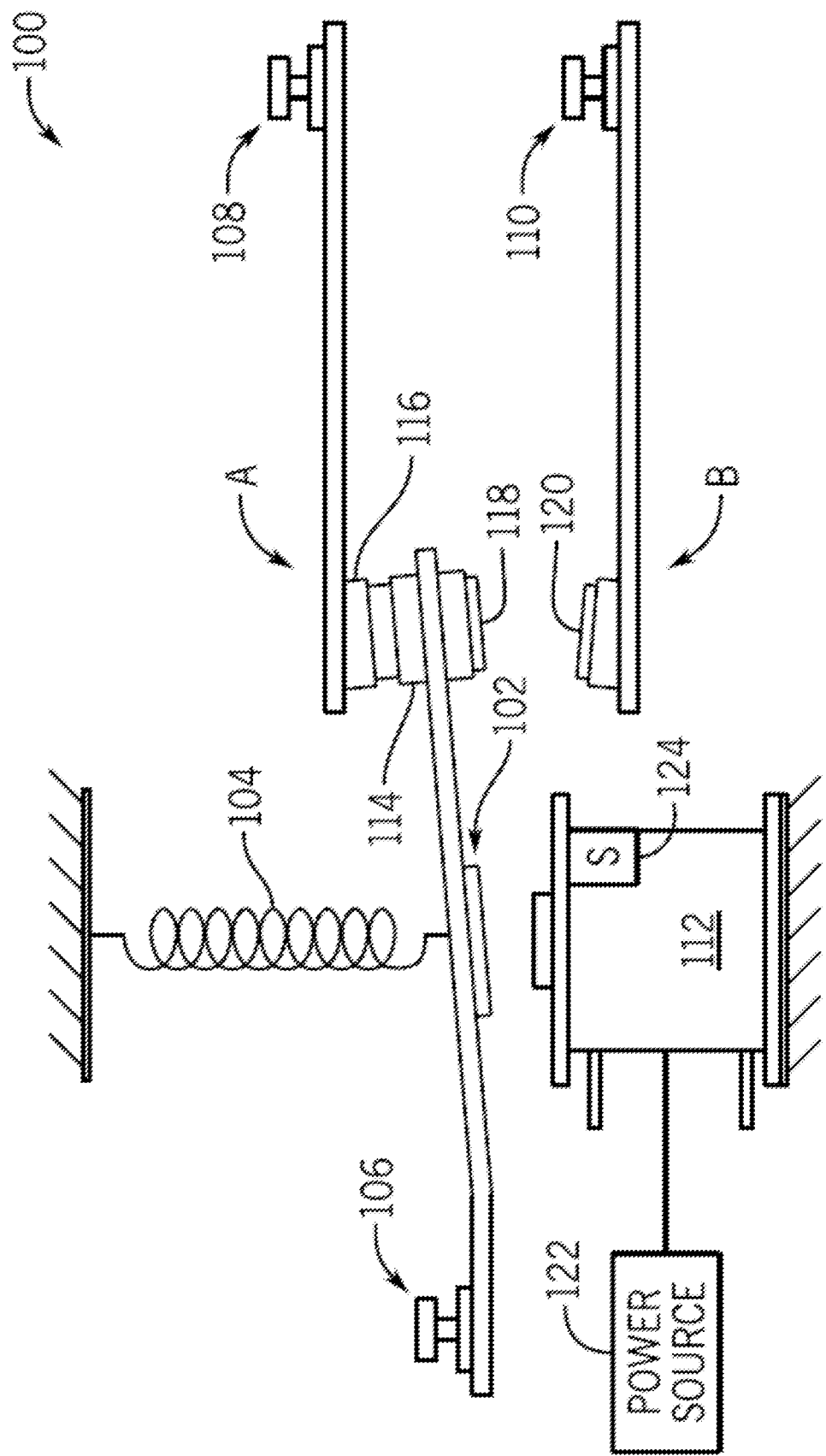
FIG. 4 is a system view of a single-pole, single current-carrying path switching device, in accordance with an embodiment described herein.

By way of example, the switching device may include multiple relay devices. Each relay device 100 may be composed of components illustrated in FIG. 4, some of which correspond to the components of the switching device described above. As shown in FIG. 4, the relay device 100 may include an armature 102 that is coupled to a spring 104. The armature 102 may have a common contact 106 that may be coupled to a part of an electrical circuit. The armature 102 may electrically couple the common contact 106 to a contact 108 or to a contact 110 depending on a state (e.g., energized) of the relay device 100. For example, when a relay coil 112 of the relay device 100 is not energized or does not receive voltage from a driving circuit, the armature 102 is positioned such that the common contact 106 and the contact 108 are electrically coupled to each other. When the relay coil 112 receives a driving voltage, the relay coil 112 magnetizes and attracts the armature 102 to itself, thereby connecting the contact 110 to the common contact 106.

The electrical connections between the common contact 106 and the contacts 108 and 110 are made via contacts 114 and 116 and contacts 118 and 120, respectively. Over time, as the contacts 114 and 116 and the contacts 118 and 120 strike against each other, the conductive material of the contacts 114, 116, 118, and 120 may begin to wear.

Moreover, the relay coil 112 may include a core that maintains a core flux during the operation of the relay device 100. That is, as the armature 102 moves between connecting to the contact 108 and the contact 110, and vice-versa, a magnetic flux may be generated in a core of the relay coil 112 and/or the armature 102. This magnetic flux may be related to the core flux of the relay coil 112 and may change over time as the relay device operates.

The contacts 114 and 116 and the contacts 118 and 120 may weld together over time as the contacts 114 and 116 and/or the contacts 118 and 120 strike against each other, thereby maintaining the armature 102 in an open position or a closed position, respectively. Accordingly, the welding of the contacts may consequently cause the relay device 100 to be in a failure state. Thus, it may be advantageous to detect whether the contacts 114 and 116 or the contacts 118 and 120 are at least partially welded together before the armature 102 of the relay device 100 begins to move during a turn-on sequence of the relay device 100.

Figure 5:
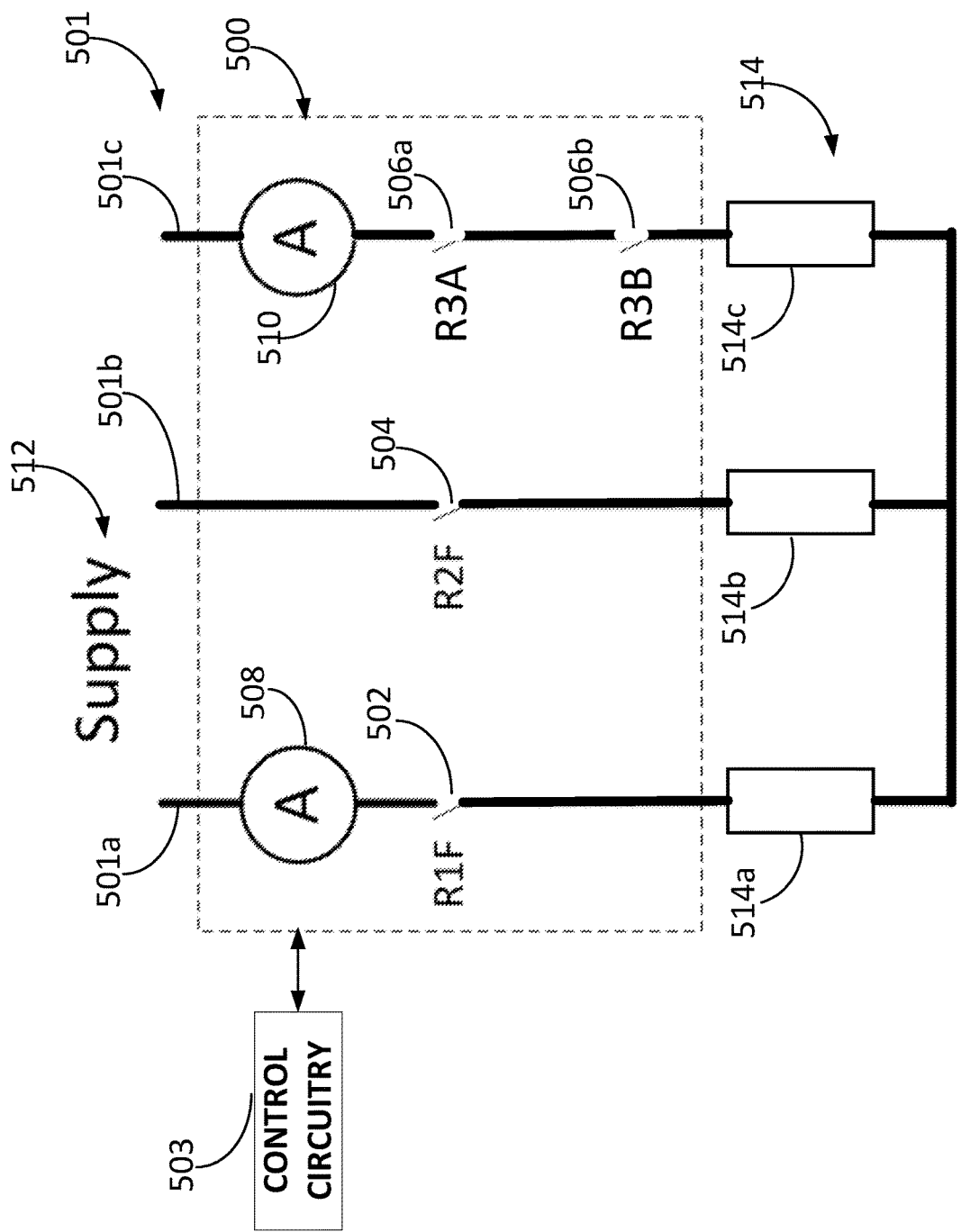
FIG. 5 is a circuit diagram of a switching device similar as the switching device 16 of FIGS. 1-3 in accordance with an embodiment described herein.

Referring now to FIG. 5, a circuit diagram of an exemplary switching device 500 is shown. The switching device 500 may be included in the switchgear 16 as described in FIGS. 1-4. In some embodiments, the switching device 500 may receive control signals for conducting weld detection from a control circuitry 503 similar to the control and monitoring circuitry as described in FIGS. 1-4. In some embodiments, the switching device 500 may include the control circuitry 503 for conducting weld detection. The switching device 500 includes a plurality of poles 501 connected between a power supply 512 and at least one load 514. The switching device 500 may include a first pole 501a connected between a first phase of the power supply 512 and a first load 514a, a second pole 501b connected between a second phase of the power supply 512 and a second load 514b, and a third pole 501c connected between a third phase of the power supply 512 and a third load 514c. Each pole 501 may include one or more relay devices. In the exemplary embodiment shown in FIG. 5, the first pole 501a may include the relay device 502, the second pole 501b may include the relay device 504, and the third pole 501c may include the relay devices 506a and 506b.

The switching device 500 may selectively connect or disconnect three-phase electric power output by the power supply 512 to the load 514, which may be an electric motor or any other powered device. In this manner, electrical power flows from the power supply 512 to the load 514. For example, the relay devices 502, 504, 506a, 506b in the switching device 500 may close to connect electric power to the load 514. On the other hand, the relay devices 502, 504, 506a, 506b in the switching device 500 may open to disconnect electric power from the load 514. In some embodiments, the power source 512 may be an electrical grid.

It should be noted that the three-phase implementation described herein is not intended to be limiting. More specifically, certain aspects of the disclosed techniques may be employed on single-phase circuitry or for applications other than power an electric motor. Additionally, it should be noted that in some embodiments, energy may flow from the power supply 512 to the load 514 and that in other embodiments, energy may flow from the load 514 to the power supply 512 (e.g., a wind turbine or another generator). In still other embodiments, energy flow from the load 514 to the power source 512 may transiently occur, for example, when overhauling a motor.

In some embodiments, one or more poles 501 may include a sensor configured to measure a current flow through the respective pole. In some embodiments, the sensor can be any suitable current measuring device. Any number of sensors may be used. In the illustrated embodiment shown in FIG. 5, the first pole 501a includes a sensor 508 and the third pole 501c includes a sensor 510. The switching device 500 utilizes the sensors 508 and 510 to detect current flows through the switching device 500 and determine whether any of the relay devices 502, 504, 506a, 506b are welded.

In an exemplary operation to determine whether the relay 502 of the first pole 501a is welded, the switching device 500 may close the relay 504 of the second pole 501b and open the relay 502 of the first pole 501a. If the relay 502 is not welded, there is no current through the circuit of the first and second poles 501a and 501b because the circuit is disconnected at the relay 502 of the first pole 501a. Thus, if the sensor 508 detects a current flow, the control circuitry 503 determines that the relay 502 is welded. In another exemplary operation to determine whether the relay 502 is welded, the switching device 500 may close the relays 506a and 506b of the third pole 501c and open the relay 502 of the first pole 501a. If the relay 502 is not welded, there is no current through the circuit of the first and the third poles 501*a* and 501*c* because the circuit is disconnected at the relay 502. Thus, if the sensor 508 or the sensor 510 detects a current flow, the switching device 500 determines that the relay 502 is welded.

In another exemplary operation to determine whether the relay 504 of the second pole 501*b* is welded, the switching device 500 may close the relay 502 of the first pole 501*a* and open the relay 504. If the relay 504 of the second pole 501*b* is not welded, there is no current through the circuit of the first and second poles 501*a* and 501*b* because the circuit is disconnected at the relay 504. Thus, if the sensor 508 detects a current flow, the control circuitry 503 determines that the relay 504 is welded. In other exemplary operations to determine whether the relay 504 is welded, the switching device 500 may close the relays 506*a* and 506*b* and open the relay 504. If the relay 504 is not welded, there is no current through the circuit of the second and the third poles 501*b* and 501*c* because the circuit is disconnected at the relay 504. Thus, if the sensor 510 detects a current flow, the switching device 500 determines that the relay 504 is welded.

In another exemplary operation to determine whether the relay 506*a* of the third pole 501*c* is welded, the switching device 500 may close the relay 502 of the first pole 501*a* and the relay 506*b* of the third pole 501*c* and open the relay 506*a* of the third pole 501*c*. If the relay 506*a* is not welded, there is no current through the circuit of the first and third poles 501*a* and 501*c* because the circuit is disconnected at the relay 506*a* of the third pole 501*c*. Thus, if the sensor 508 and/or the sensor 510 detect a current flow, the control circuitry 503 determines that the relay 506*a* is welded. In another exemplary operation to determine whether the relay 506*a* of the third pole 501*c* is welded, the switching device 500 may close the relays 506*b* and 504 and open the relay 506*a*. If the relay 506*a* is not welded, there is no current through the circuit of the second and third poles 501*b* and 501*c* because the circuit is disconnected at the relay 506*a* of the third pole 501*c*. Thus, if the sensor 510 detects a current flow, the control circuitry 503 determines that the relay 506*a* is welded.

Similarly, to determine whether the relay 506*b* of the third pole 501*c* is welded, the switching device 500 may close the relays 502 and 506*a* and open the relay 506*b*. If the relay 506*b* is not welded, there is no current through the circuit of the first and third poles 501*a* and 501*c* because the circuit is disconnected at the relay 506*b*. Thus, if the sensor 508 and/or the sensor 510 detect a current flow, the control circuitry 503 determines that the relay 506*b* is welded. In another exemplary operation to determine whether the relay 506*b* is welded, the switching device 500 may close the relays 506*a* and 504 and open the relay 506*b*. If the relay 506*b* is not welded, there is no current through the circuit of the second and the third poles 501*b* and 501*c* because the circuit is disconnected at the relay 506*b*. Thus, if the sensor 510 detects a current flow, the switching device 500 determines that the relay 506*b* is welded.

The switching device 500 may detect whether the relays 502, 504, 506*a*, 506*b* are welded in a sequential manner, such that the switching device 500 may perform detection of more than one relay 502, 504, 506*a*, 506*b*. The switching device 500 may use any suitable sequence depending on a switch type and one or more operating characteristics (e.g., operating voltage, operating current, operating power, etc.) of the switching device 500. In exemplary embodiments, a short current and/or voltage pulse may be provided to the relay that is under weld detection. The short current and/or voltage may eliminate potential conductivity problems for double break relays.

The switching device 500 may use different sequences to provide weld detection for the relays 502, 504, 506*a*, 506*b* each time that the switching device is turned on. The relays 502, 504, 506*a*, 506*b* may be closed in a different sequential order to reduce contact wear (e.g., erosion) on the relays that are turned on last in the sequence, due to contact bouncing and arc effect. For example, during a first turning on operation of the switching device 500, the relays 502 and 506*a* are first closed. The relays 504 and 506*b* are subsequently closed to turn on the switching device 500. After an operation of the switching device, 500, the switching device 500 may then be turned off. During a second turning on operation of the switching device 500, the relays 504 and 506*b* are first closed prior to the relays 502 and 506*a* being closed to turned on the switching device 500. During the first turning on operation, the relays 504 and 506*b* are closed last and thus may be affected by the bouncing and arc effect. During the second turning on operation, the relays 502 and 506*a* are closed last and thus may be affected by the bouncing and arc effect. In this way, the bouncing and arc effect does not apply to the same relays that are closed last, such that severe contact wear on the relays may be prevented. In other words, the causing effect of contact wear is evenly distributed among all of the relays.

The switching device 500 may provide the weld detection before it is turned on (e.g., closed or connected). In other embodiments, the switching device 500 may provide the weld detection during a turning on process. In this way, the switching device 500 may reduce a total run on time. If no weld relay device is detected, the switching device 500 is turned on. If one or more weld relay devices are detected, the switching device 500 may proceed with a turn off sequence. In some embodiments, the turn off sequence may include: 1) closing all relay devices after the weld detection, 2) waiting until a transient phase for the load 514 is over, 3) opening all the relay devices. In these embodiments, multiple weld relay devices may be handled at the same time. In other embodiments, the turn off sequence may include closing the detected welded relay device according to an open single phase sequence (e.g., opened at specific points on the electric power waveform) of the switching device 500. In these other embodiments, the switching device 500 may reduce arc energy and increase breaking capacity. In other embodiments, the turn off sequence may include closing the detected welded relay devices immediately after being detected.

Figure 6:
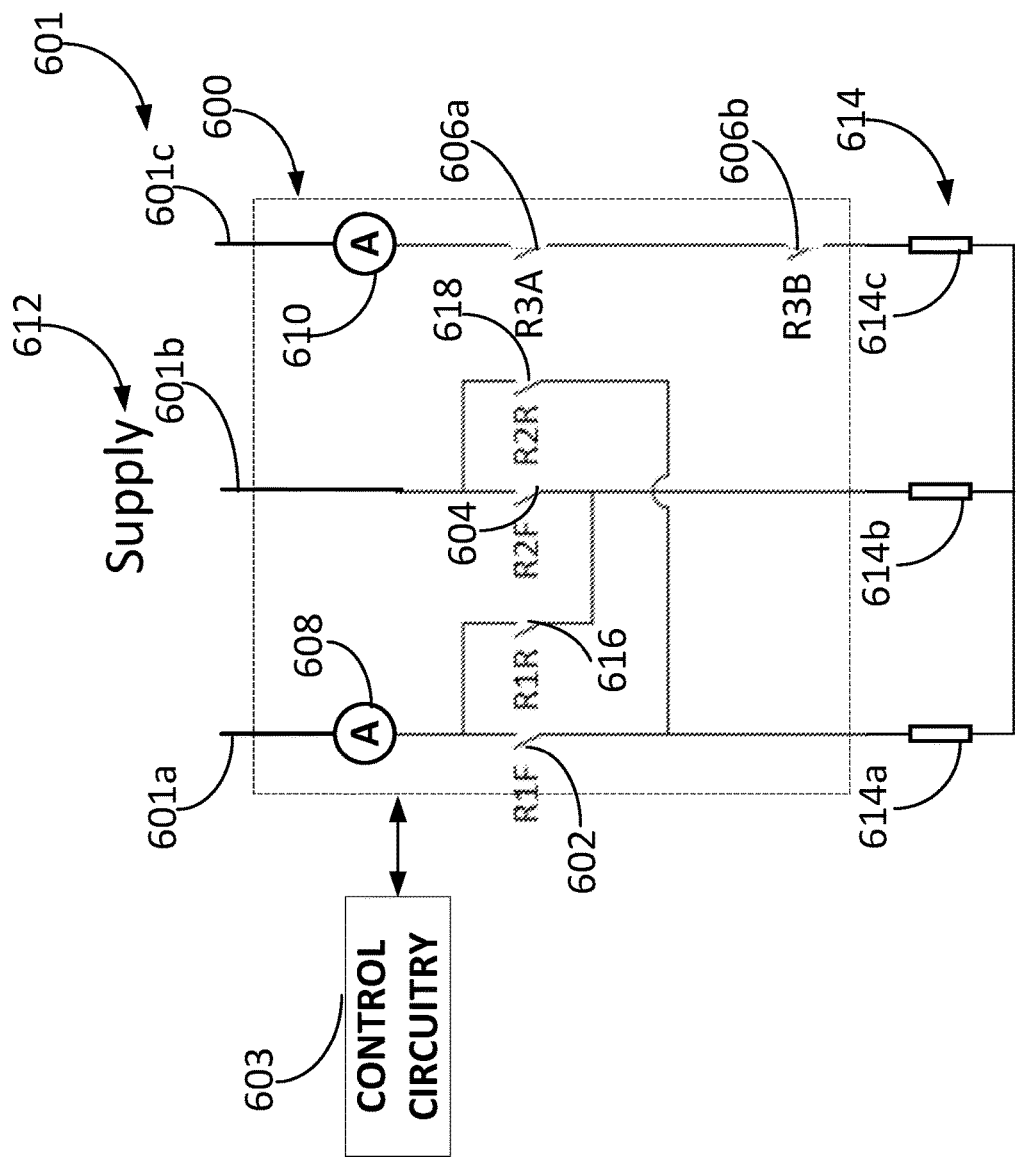
FIG. 6 is a circuit diagram of a switching device similar as the switching device 16 of FIGS. 1-3 in accordance with another embodiment described herein.

Referring now to FIG. 6, a circuit diagram of an exemplary switching device 600 is shown. The switching device 600 may be included in the switchgear 16 as described in FIGS. 1-4. The switching device 600 may receive control signals for conducting weld detection from a control circuitry 603 similar as the control and monitoring circuitry as described in FIGS. 1-4. In some embodiments, the switching device 600 may include the control circuitry 603 for conducting weld detection. The switching device 600 includes a plurality of poles 601 connected between a power supply 612 and at least one load 614. The switching device 600 may include a first pole 601*a* connected between a first phase of the power supply 612 and a first load 614*a*, a second pole 601*b* connected between a second phase of the power supply 612, and a second load 614*b*, and a third pole 601*c* connected between a third phase of the power supply 612 and a third load 614*c*. Each pole 601 may include one or more relay devices. In the exemplary embodiment shown in FIG. 6, the first pole 601*a* may include the relay device 602, the second pole 601b may include the relay device 604, and the third pole 601c may include the relay devices 606a and 606b.

The switching device 600 may further include a relay device 616 connected between the first pole 601a and the second pole 601b and configured to reverse the phase power on the second pole 601b from the second phase power to the first phase power when the relay device 616 is closed. The switching device 600 may also include a relay device 618 connected between the first pole 601a and the second pole 601b and configured to reverse the phase power on the first pole 601a from the first phase power to the second phase power when the relay device 618 is closed.

The switching device 600 may selectively connect or disconnect three-phase electric power output by the power supply 612 to the load 614, which may be an electric motor or any other powered device. In this manner, electrical power flows from the power supply 612 to the load 614. For example, the relay devices in the switching device 600 may close to connect electric power to the load 614. On the other hand, the relay devices in the switching device 600 may open to disconnect electric power from the load 614. In some embodiments, the power source 612 may be an electrical grid.

It should be noted that the three-phase implementation described herein is not intended to be limiting. More specifically, certain aspects of the disclosed techniques may be employed on single-phase circuitry or for applications other than power an electric motor. Additionally, it should be noted that in some embodiments, energy may flow from the power supply 612 to the load 614 and that in other embodiments, energy may flow from the load 614 to the power supply 612 (e.g., a wind turbine or another generator). In still other embodiments, energy flow from the load 614 to the power source 612 may transiently occur, for example, when overhauling a motor.

In some embodiments, one or more poles 601 may include a sensor configured to measure a current flow through the respective pole. The switching device 600 may include any suitable number of sensors for detecting current and welding relay devices. For example, the first pole 601a includes a sensor 608 and the third pole 601c includes a sensor 610. The switching device 600 utilizes the sensors 608 and 610 to detect current flows through the switching device 600 and determine whether any of the relay devices 602, 604, 606a, 606b, 616, and 618, are welded.

In some embodiments, the switching device 600 may conduct weld detection on the relay devices 602, 604, 606a, and 606b similarly as the relay devices 502, 504, 506a, and 506b respectively. The switching device 600 may detect the relay devices in any suitable sequence depending on one or more operating characteristics (e.g., operating voltage, operating current, operating power, etc.) of the switching device 600.

Figure 7A:
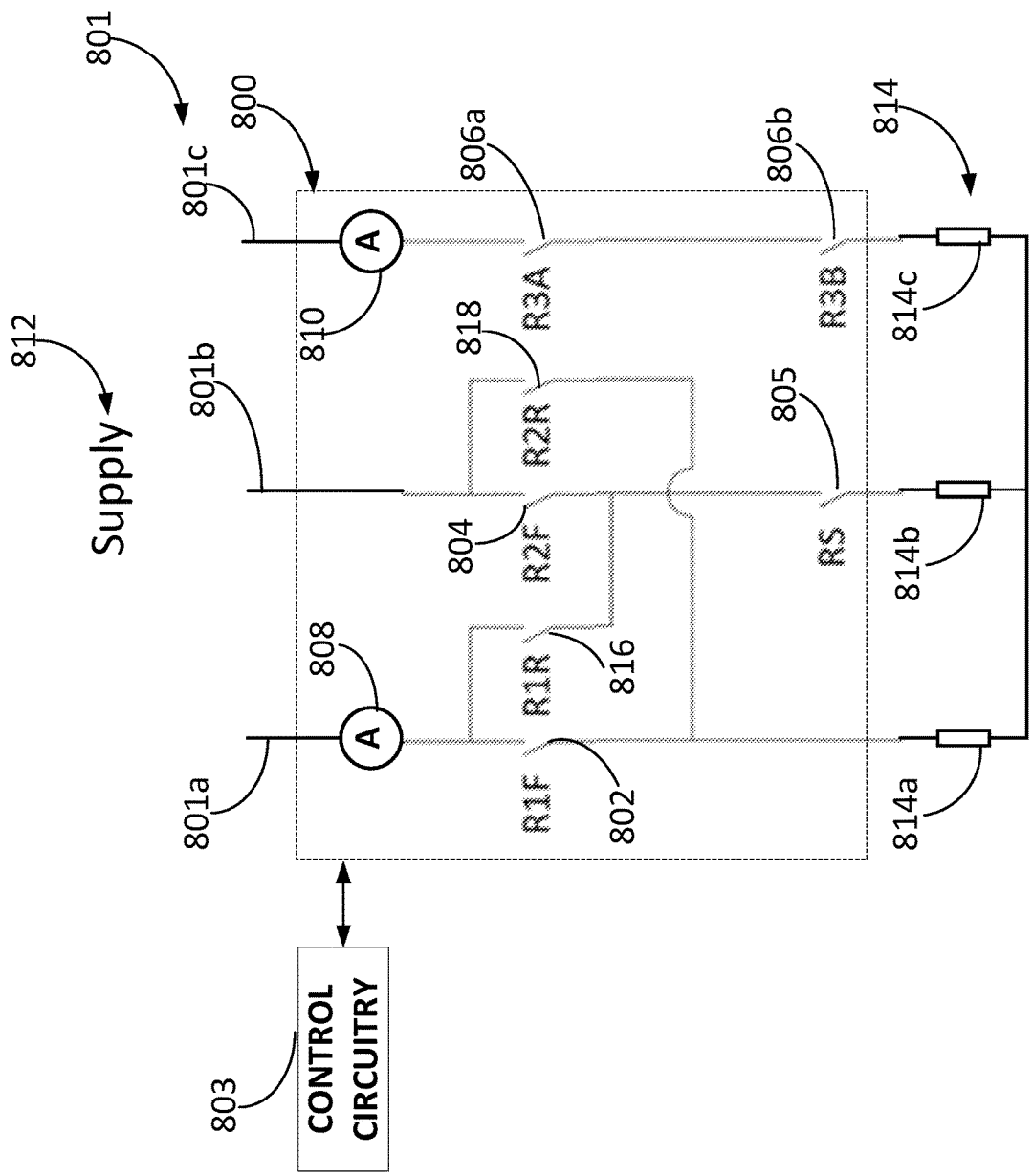
FIGS. 7a-7d are circuit diagrams of a switching device implementing a safety relay according to various exemplary embodiments.
Figure 7B:
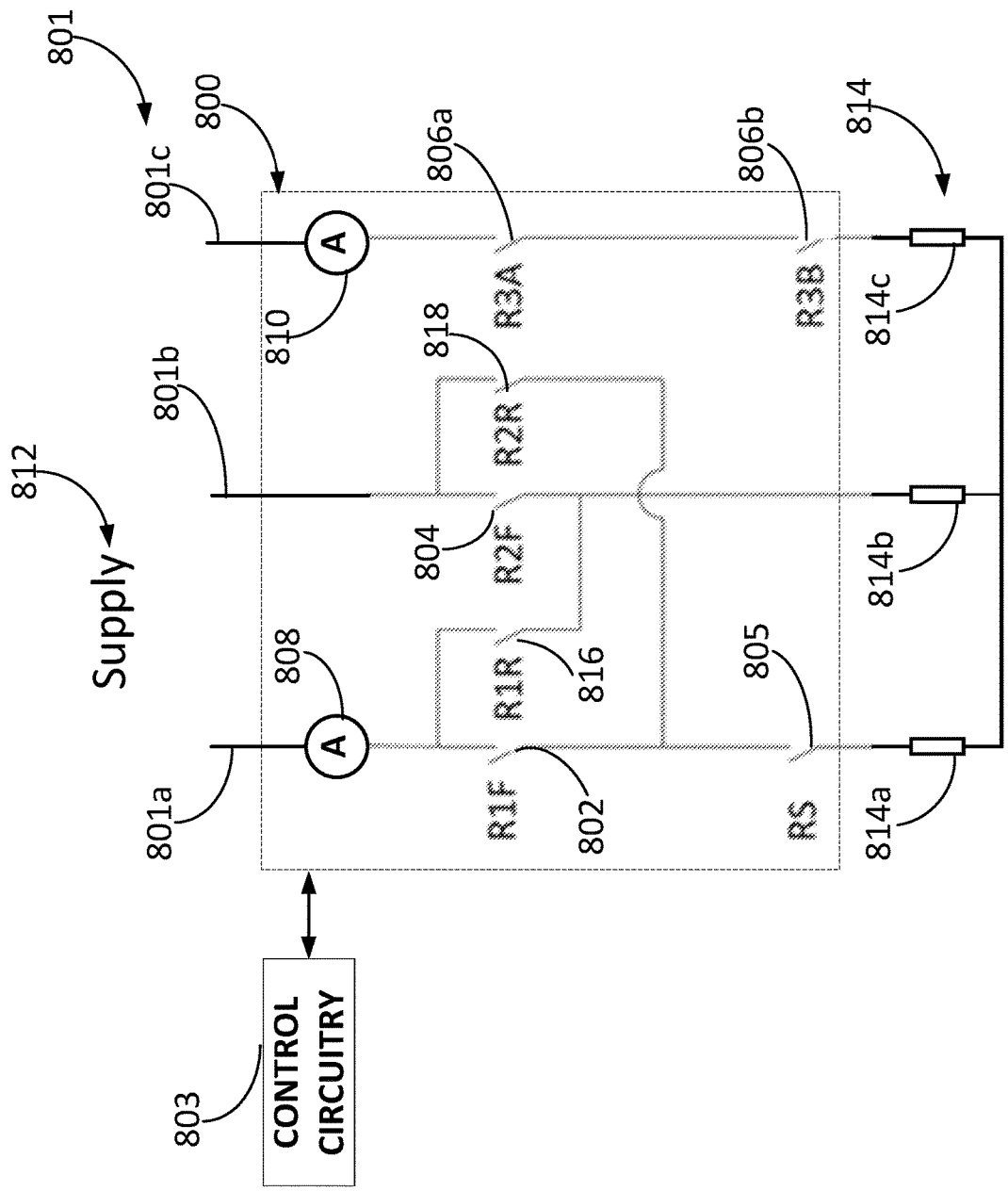
Figure 7C:
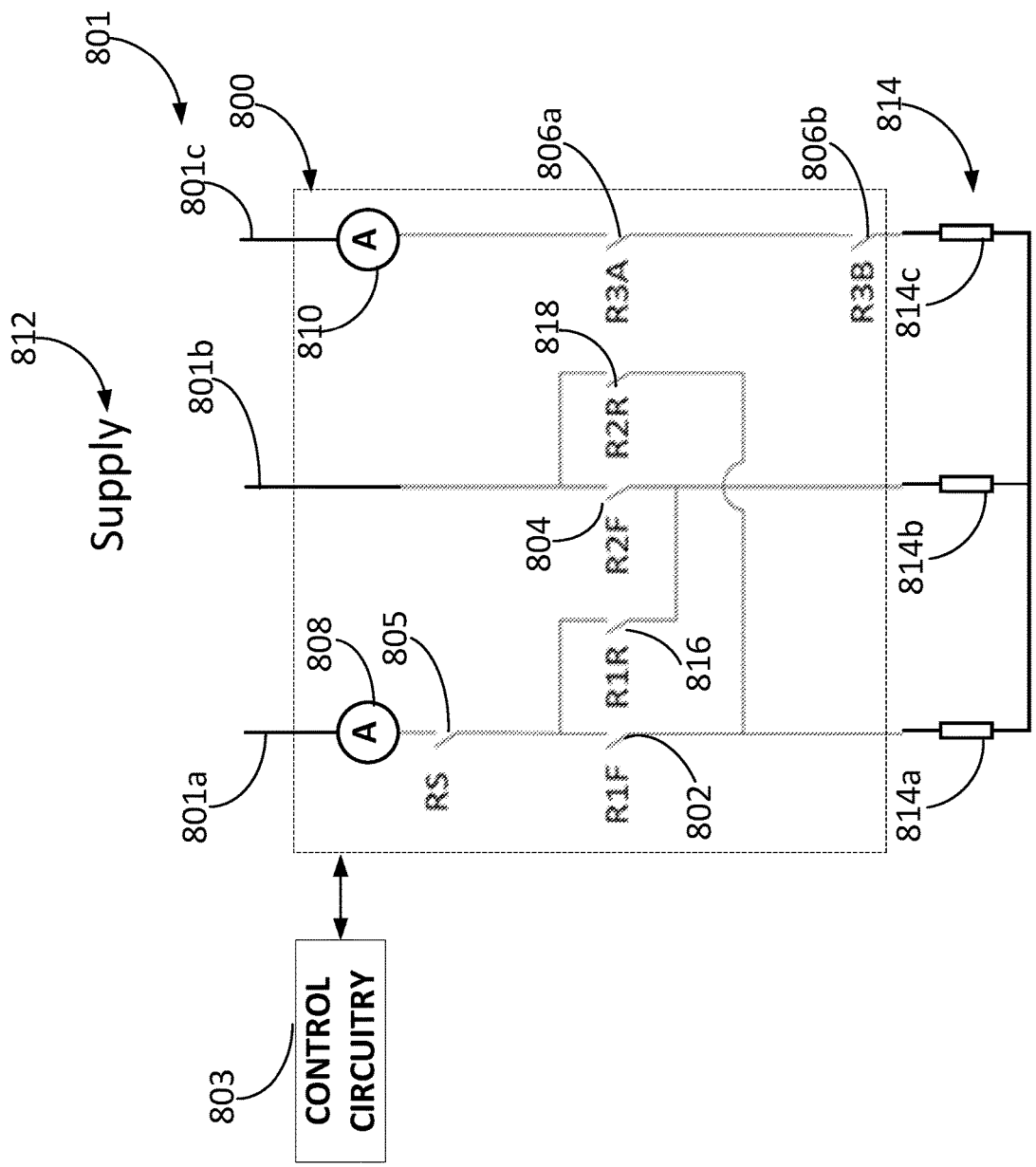
Figure 7D:
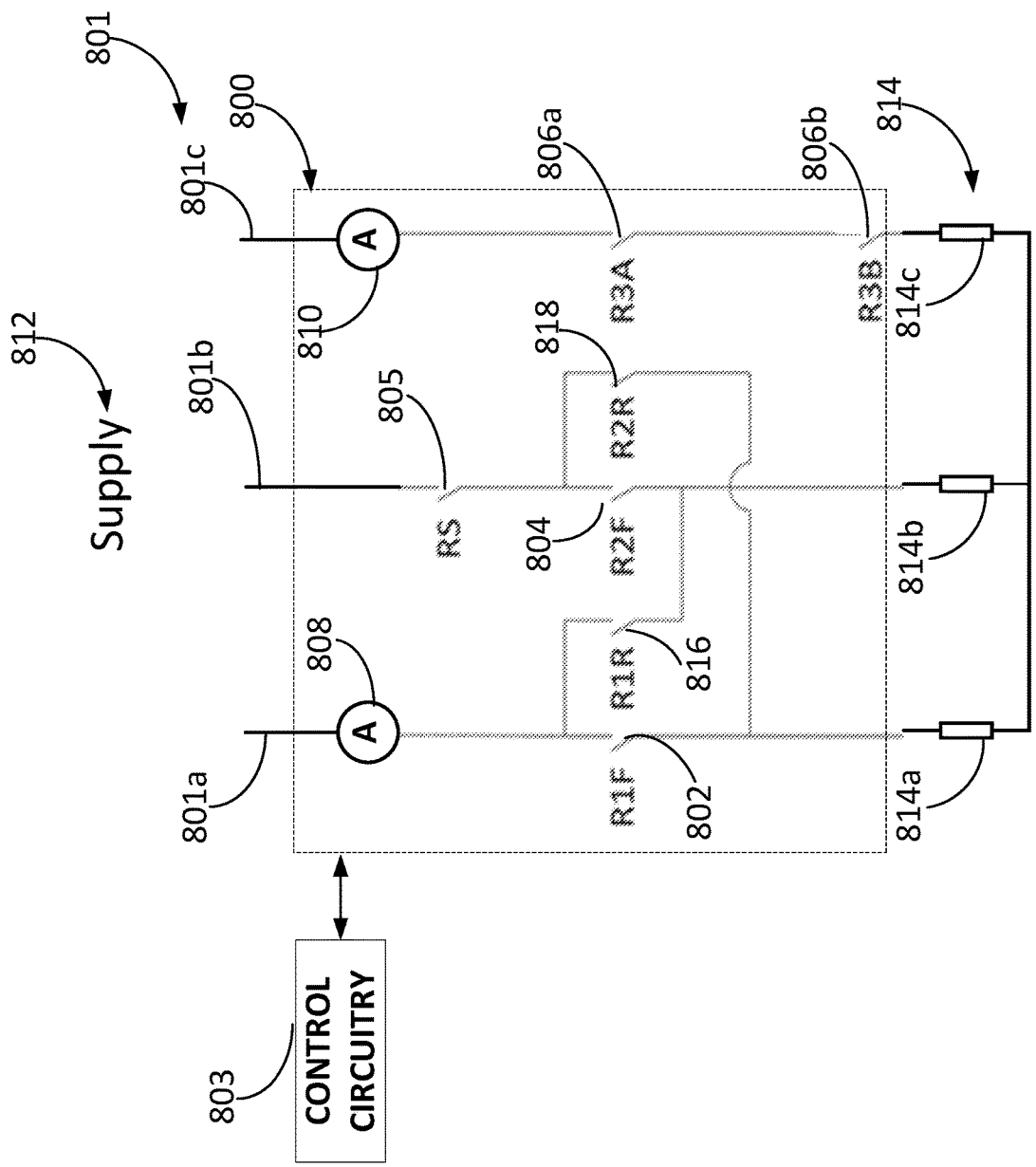

Referring to FIGS. 7a-7d, circuit diagrams of a switching device 800 implementing a safety relay 805 is shown according to various exemplary embodiments. The switching device 800 may operates under a relative low operating current (e.g., 9A). The switching device 800 includes circuit components that are similar as the switching device 600 of FIG. 6, such as the relays 802, 804, 806a, 806b, 816, and 818, the control circuitry 803, and the sensors 808 and 810. In addition, the switching device 800 also includes a safety relay 805 that may be deployed in the first pole 801a or second pole 801b. The safety relay 805 may be connected between a second load 814b and the relay 804 in the second pole 801b as shown in FIG. 7a according to a first exemplary embodiment. The safety relay 805 may be connected between a first load 814a and the relay 802 in the first pole 801a as shown in FIG. 7b according to a second exemplary embodiment. The safety relay 805 may be connected between the sensor 808 and the relay 802 in the first pole 801a as shown in FIG. 7c according to a third exemplary embodiment. The safety relay 805 may be connected between a second phase of a power supply 812 and the relay 804 in the second pole 801b as shown in FIG. 7d according to a fourth exemplary embodiment. In each of these exemplary embodiments, one or more relays may be shorted in one or more operating scenarios. For example, when the switching device 800 operates in a forward manner (e.g., a non-reversing manner), the reverse relays 816 and 818 are shorted. When the switching device 800 operates in a reverse manner, no relay is shorted.

Figure 8:
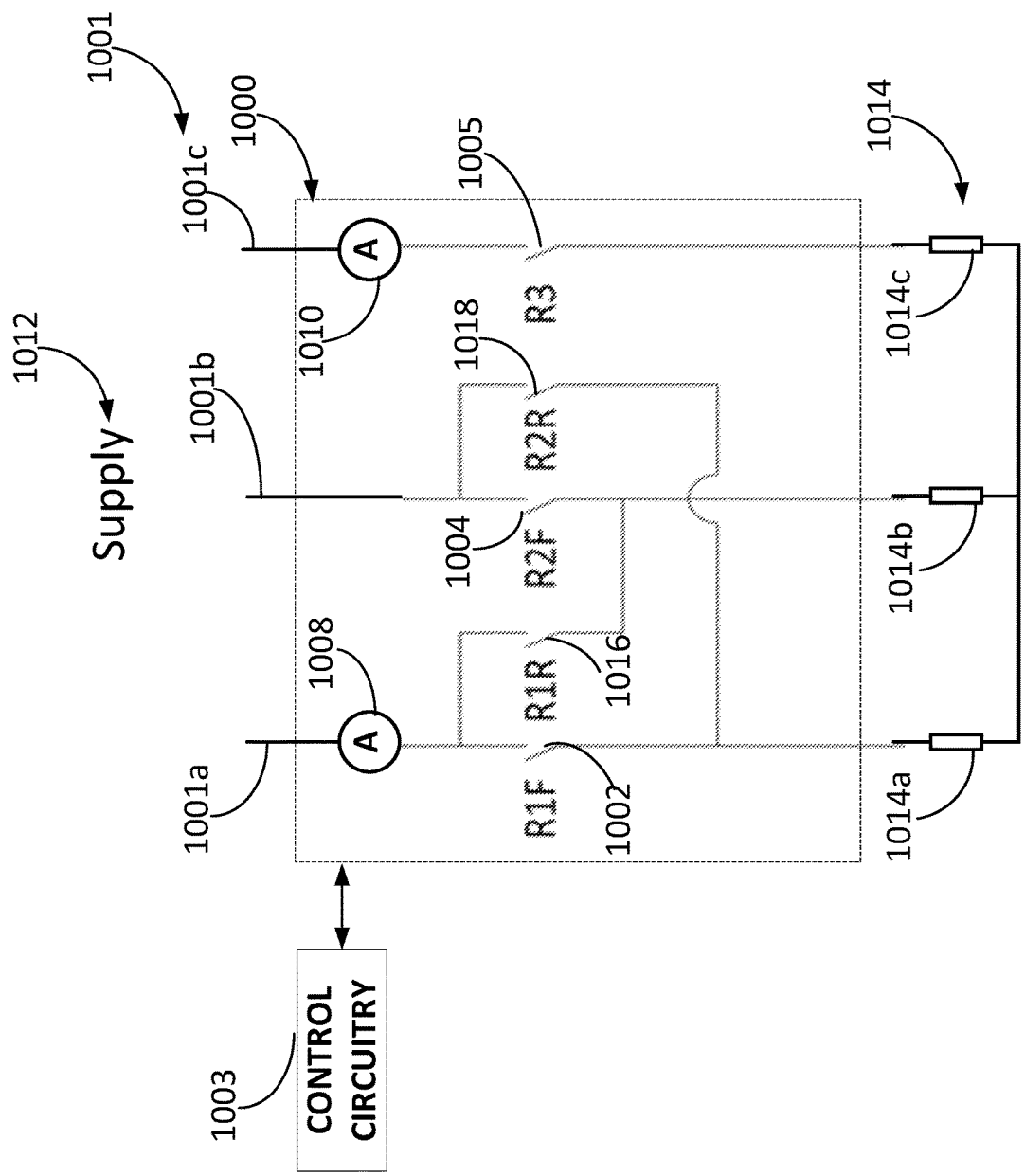
FIG. 8 is a circuit diagram of a switching device implementing a safety relay according to another exemplary embodiment described herein.

Referring to FIG. 8, a circuit diagram of a switching device 1000 implementing a safety relay 1005 is shown according to various exemplary embodiments. The switching device 1000 may operates under a relative high operating current (e.g., 23A). The switching device 1000 includes circuit components that are similar as the switching device 600 of FIG. 6, such as the relays 1002, 1004, 1016, and 1018, the control circuitry 1003, and the sensors 1008 and 1010. In addition, the switching device 800 also includes a safety relay 1005 that may be deployed in the third pole 1001c. In one or more operating scenarios of the switching device 1000, one or more relays may be shorted. For example, when the switching device 1000 operates in a forward manner (e.g., a non-reversing manner), the reverse relays 1016 and 1018 are shorted. When the switching device 1000 operates in a reverse manner, no relay is shorted.

Figure 9:
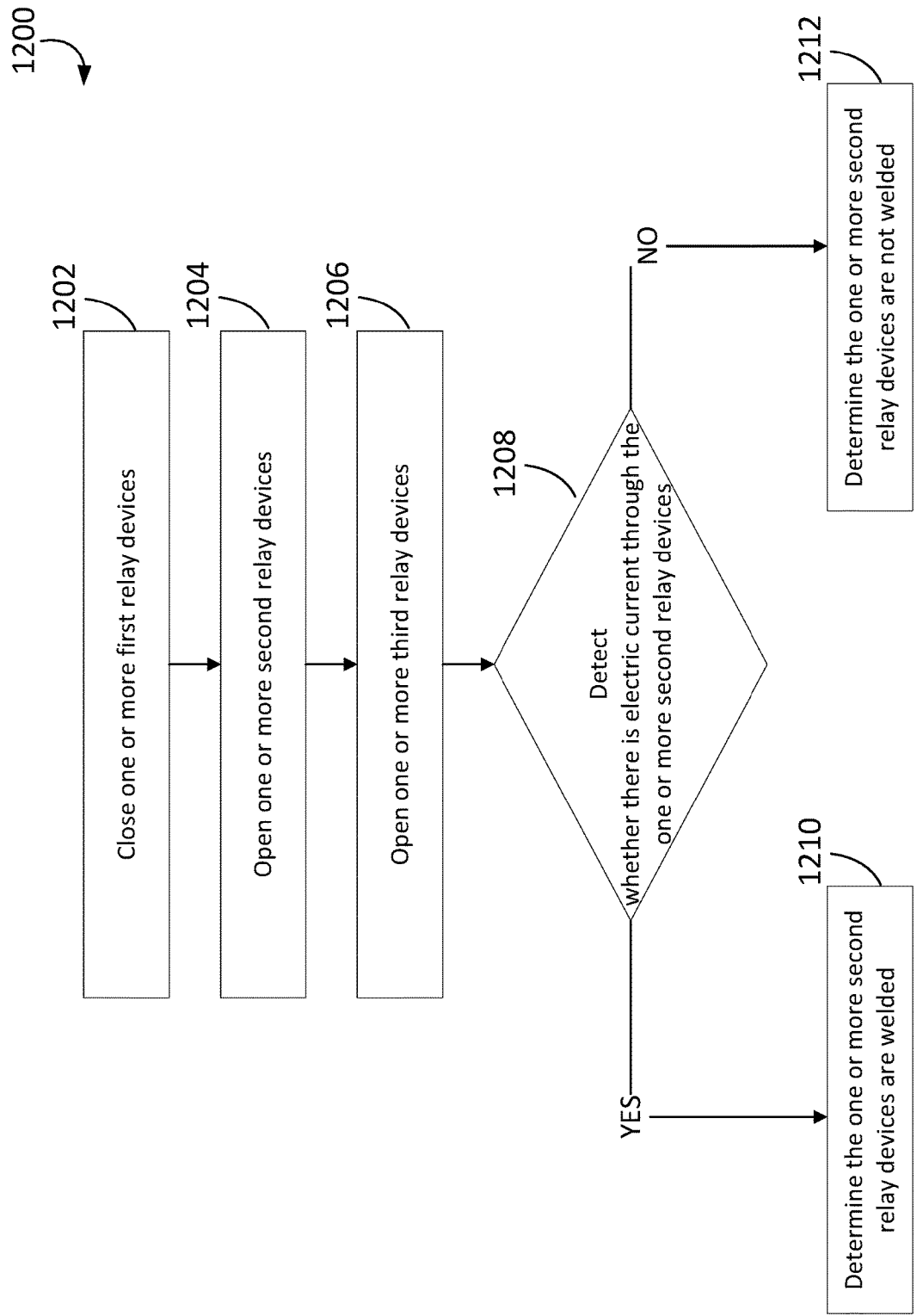
FIG. 9 is a flow chart of a method for providing weld detection by a switching device in accordance with an embodiment described herein.

Referring to FIG. 9, a flow chart of a method 1200 for providing weld detection by a switching device is shown. The switching device may be similar as the switching device 500 shown in FIG. 5, the switching device 600 shown in FIG. 6, the switching device 800 shown in FIGS. 7a-7d, or the switching device 1000 shown in FIG. 8. At operation 1202, the switching device closes one or more first relay devices (e.g., relay devices 502, 602, 802, 1002). The one or more first relay devices are on a first pole (e.g., 501a, 601a, 801a, 1001a) of the switching device which selectively connects and disconnects a first phase of a power source with a first load.

At operation 1204, the switching device opens one or more second relay devices (e.g., relay devices 504, 604, 804, 1004). The one or more second relay devices are on a second pole (e.g., 501b, 601b, 801b, 1001b) of the switching device which selectively connects and disconnects a second phase of the power source with a second load.

At operation 1206, the switching device opens one or more third relay devices. The one or more third relay devices (e.g., relay devices 506a, 506b, 606a, 606b, 806a, 806b) are on a third pole (e.g., 501c, 601c, 801c, 1001c) of the switching device which selectively connects and disconnects a third phase of the power source with a third load.

At operation 1208, the switching device detect whether there is electric current through the one or more second relay devices. In response to detecting that there is electric current through the one or more second relay devices, at operation 1210, the switching device determines that the one or more second relay devices are welded. In response to detecting that there is no electric current through the one or more second relay devices, at operation 1212, the switching device determines that the one or more second relay devices are not welded. In some embodiments, switching device detects the current by any suitable sensing methods, such as connecting a current sensor on one of the poles.

It should also be noted that although certain embodiments described herein are described in the context or contacts that are part of a relay device, it should be understood that the embodiments described herein may also be implemented in suitable contactors and other switching components. It should also be noted that while some embodiments described herein are detailed with reference to a particular relay device or contactor described in the specification, it should be understood that these descriptions are provided for the benefit of understanding how certain techniques are implemented. Indeed, the systems and methods described herein are not limited to the specific devices employed in the descriptions above.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:
1. A system, comprising:
   a power source; and
   a switching device, comprising:
      one or more first relay devices configured to selectively connect and disconnect a first phase of electric power from the power source;
      one or more second relay devices configured to selectively connect and disconnect a second phase of electric power from the power source; and
      one or more third relay devices configured to selectively connect and disconnect a third phase of electric power from the power source;
   a first current measuring device configured to detect current through the one or more first relay devices and a second current measuring device configured to detect current through the one or more third relay devices; and
   a control system configured to:
      in a first operation,
         close the one or more second relay devices;
         open the one or more first relay devices;
         detect whether there is electric current through the one or more first relay devices by utilizing the first current measuring device; and
         in response to detecting that there is electric current through the one or more first relay devices, determine that the one or more first relay devices are welded, and
      in a second operation,
         close the one or more third relay devices;
         open the one or more first relay devices;
         detect whether there is electric current through the one or more first relay devices by utilizing the first current measuring device, or detect whether there is electric current through the one or more third relay devices utilizing the second current measuring device; and
         in response to detecting that there is electric current, determine that the one or more first relay devices are welded.
2. The system of claim 1, wherein the control system is further configured to:
   detect whether there is electric current through the one or more third relay devices; and
   in response to detecting that there is electric current through the one or more third relay devices, determine that the one or more third relay devices are welded.
3. The system of claim 2, wherein the control system is further configured to:
   in response to detecting that there is no electric current through the one or more third relay devices, determine that the one or more third relay devices are not welded.
4. The system of claim 1, wherein the control system is further configured to:
   in response to detecting that there is no electric current through the one or more first relay devices, determine that the one or more first relay devices are not welded.
5. The system of claim 1, wherein the control system is further configured to:
   in a third operation,
      close the one or more first relay devices;
      open the one or more second relay devices;
      detect whether there is electric current; and
      in response to detecting that there is electric current, determine that the one or more second relay devices are welded.
6. The system of claim 1, wherein the one or more first relay devices are on a first pole of the switching device, the one or more second relay devices are on a second pole of the switching device, and the one or more third relay devices are on a third pole of the switching device.
7. The system of claim 6, wherein the first pole is connected between the first phase of the power source and a first load, the second pole is connected between the second phase of the power source and a second load, and the third pole is connected between the third phase of the power source and a third load.
8. A method for providing weld detection in a switching system, comprising:
   opening one or more first relay devices in a first operation, wherein the one or more first relay devices are configured to selectively connect and disconnect a first phase of electric power from a power source;
   closing one or more second relay devices in the first operation, wherein the one or more second relay devices are configured to selectively connect and disconnect a second phase of electric power from the power source;
   providing a first current measuring device configured to detect current through the one or more first relay devices and a second current measuring device configured to detect current through one or more third relay devices configured to selectively connect and disconnect a third phase of electric power from the power source;
   in the first operation, detecting whether there is electric current through the one or more first relay devices by utilizing the first current measuring device; and
   in the first operation, in response to detecting that there is electric current through the one or more second relay devices, determining that the one or more first relay devices are welded; and
   in a second operation,
      closing the one or more third relay devices;
      opening the one or more first relay devices;
      detecting whether there is electric current through the one or more first relay devices by utilizing the first current measuring device, or detecting whether there is electric current through the one or more third relay devices utilizing the second current measuring device; and in response to detecting that there is electric current, determining that the one or more first relay devices are welded.

9. The method of claim 8, further comprising:
detecting whether there is electric current through the one or more third relay devices; and
in response to detecting that there is electric current through the one or more third relay devices, determining that the one or more third relay devices are welded.

10. The method of claim 9, further comprising:
in response to detecting that there is no electric current through the one or more third relay devices, determine that the one or more third relay devices are not welded.

11. The method of claim 8, further comprising:
in response to detecting that there is no electric current through the one or more first relay devices, determine that the one or more first relay devices are not welded.

12. The method of claim 8, further comprising:
in a third operation,
closing the one or more first relay devices;
opening the one or more second relay devices;
detecting whether there is electric current; and
in response to detecting that there is electric current, determining that the one or more second relay devices are welded.

13. The method of claim 12, further comprising, in response to determining that the one or more second relay devices are welded, opening the one or more first relay devices.

14. The switching device of claim 13, wherein the control circuitry is further configured to:
detect whether there is electric current through the one or more third relay devices; and
in response to detecting that there is electric current through the one or more third relay devices, determine that the one or more third relay devices are welded.

15. The switching device of claim 14, wherein the control circuitry is further configured to:
in response to detecting that there is no electric current through the one or more third relay devices, determine that the one or more third relay devices are not welded.

16. The method of claim 8, wherein the one or more first relay devices are on a first pole of the switching system, the one or more second relay devices are on a second pole of the switching system, and the one or more third relay devices are on a third pole of the switching system.

17. The method of claim 8, wherein the first pole is connected between the first phase of the power source and a first load, the second pole is connected between the second phase of the power source and a second load, and the third pole is connected between the third phase of the power source and a third load.

18. The method of claim 8, further comprising:
closing the first, second, and third one or more relay devices in a first sequential order during a first turning on operation of the switching system;
turning off the switching system; and
closing the first, second, and third one or more relay devices in a second sequential order that is different than the first sequential order during a second turning on operation of the switching system.

19. A switching device, comprising:
one or more first relay devices configured to selectively connect and disconnect a first phase of electric power from a power source;
one or more second relay devices configured to selectively connect and disconnect a second phase of electric power from the power source;
one or more third relay devices configured to selectively connect and disconnect a third phase of electric power from the power source;
a first current measuring device configured to detect current through the one or more first relay devices and a second current measuring device configured to detect current through the one or more third relay devices; and
a control circuitry configured to:
in a first operation,
close the one or more second relay devices;
open the one or more first relay devices;
detect whether there is electric current through the one or more first relay devices by utilizing the first current measuring device; and
in response to detecting that there is electric current through the one or more first relay devices, determine that the one or more first relay devices are welded; and
in a second operation,
close the one or more third relay devices;
open the one or more first relay devices;
detect whether there is electric current through the one or more first relay devices by utilizing the first current measuring device, or detect whether there is electric current through the one or more third relay devices utilizing the second current measuring device; and
in response to detecting that there is electric current, determine that the one or more first relay devices are welded.

* * * * *